(12) United States Patent
Topping (10) Patent No.: US 10,797,184 B2
(45) Date of Patent: Oct. 6, 2020

(54) APERTURE IN A SEMICONDUCTOR (71) Applicant: POWER ROLL LIMITED, Sunderland (GB)

(72) Inventor: Alexander John Topping, Sunderland (GB)

(73) Assignee: POWER ROLL LIMITED, Sunderland (GB)

( * ) Notice: Subject to any disclaimer, the term of this patent is extended or adjusted under 35 U.S.C. 154(b) by 0 days.

(21) Appl. No.: 16/091,595

(22) PCT Filed: Apr. 6, 2017

(86) PCT No.: PCT/GB2017/050968
§ 371 (c)(1),
(2) Date: Oct. 5, 2018

(87) PCT Pub. No.: WO2017/174993
PCT Pub. Date: Oct. 12, 2017

(65) Prior Publication Data
US 2019/0088803 A1 Mar. 21, 2019

(30) Foreign Application Priority Data
Apr. 7, 2016 (GB) .................. 1605916.4

(51) Int. Cl.
*H01L 31/0224* (2006.01)
*H01L 31/0352* (2006.01)
(Continued)

(52) U.S. Cl.
CPC .......... *H01L 31/022425* (2013.01); *H01L 31/02167* (2013.01); *H01L 31/0392* (2013.01);
(Continued)

(58) Field of Classification Search
CPC ............ H01L 31/0216; H01L 31/0236; H01L 31/02366; H01L 31/02363; H01L 31/0352;
(Continued)

(56) References Cited

U.S. PATENT DOCUMENTS 3,948,682 A 4/1976 Bordina et al.
4,110,122 A 8/1978 Kaplow et al.
(Continued)

FOREIGN PATENT DOCUMENTS

DE 19943720 5/2000
DE 19937724 12/2000
(Continued)

OTHER PUBLICATIONS

International Search Report and Written Opinion dated Jun. 23, 2017 in International Application No. PCT/GB2017/050968 (10 pages).
(Continued)

*Primary Examiner* — Susan D Leong
(74) *Attorney, Agent, or Firm* — Meunier Carlin & Curfman LLC (57) ABSTRACT

An optoelectronic device comprising a substrate comprising a groove having a first and a second face. The first face of the groove is coated with a conductor material and the second face of the groove coated with a semiconductor material. The conductor material and the semiconductor material are in contact with another semiconductor material in the groove. There is an aperture in the another semiconductor material. The first face, second face, the conductor material and the semiconductor material are all in contact with the another semiconductor material in the groove.

16 Claims, 10 Drawing Sheets

(51) Int. Cl.
*H01L 31/0392* (2006.01)
*H01L 31/0216* (2014.01)
*H01L 31/072* (2012.01)
(52) U.S. Cl.
CPC .... *H01L 31/035281* (2013.01); *H01L 31/072* (2013.01); *Y02E 10/50* (2013.01)
(58) Field of Classification Search
CPC .................. H01L 31/047; H01L 31/05; H01L 31/035281
See application file for complete search history.

(56) References Cited

U.S. PATENT DOCUMENTS

| | | | |
|---|---|---|---|
| 4,283,589 | A | 8/1981 | Kaplow et al. |
| 4,295,002 | A | 10/1981 | Chappell et al. |
| 4,335,503 | A | 6/1982 | Evans et al. |
| 4,379,944 | A | 4/1983 | Borden et al. |
| 5,067,985 | A | 11/1991 | Carver et al. |
| 5,147,468 | A | 9/1992 | Deguchi |
| 5,689,358 | A | 11/1997 | Nakao et al. |
| 5,782,993 | A * | 7/1998 | Ponewash ............. H01L 31/048 136/246 |
| 6,084,175 | A | 7/2000 | Perry et al. |
| 6,090,661 | A | 7/2000 | Perng et al. |
| 6,762,359 | B2 | 7/2004 | Asai et al. |
| 2004/0238833 | A1 | 12/2004 | Nakata |
| 2005/0022860 | A1 | 2/2005 | Toh et al. |
| 2005/0115602 | A1* | 6/2005 | Senta ................ H01L 31/03528 136/250 |
| 2007/0034250 | A1 | 2/2007 | Dutta |
| 2008/0202581 | A1 | 8/2008 | Kempa et al. |
| 2009/0014056 | A1 | 1/2009 | Hockaday |
| 2010/0089443 | A1 | 4/2010 | Bloomstein et al. |
| 2010/0244056 | A1 | 9/2010 | Ray et al. |
| 2010/0275964 | A1 | 11/2010 | Kinoshita |
| 2010/0285631 | A1 | 11/2010 | Mccann et al. |
| 2010/0294536 | A1 | 11/2010 | Usami |
| 2010/0294539 | A1 | 11/2010 | Sasaki et al. |
| 2011/0036391 | A1 | 2/2011 | McMormick et al. |
| 2011/0290323 | A1 | 12/2011 | Lee et al. |
| 2012/0080087 | A1 | 4/2012 | Denby |
| 2012/0298175 | A1 | 11/2012 | Van Roosmalen et al. |
| 2013/0160818 | A1 | 6/2013 | Li et al. |
| 2013/0298980 | A1 | 11/2013 | Fogel et al. |
| 2014/0238461 | A1 | 8/2014 | Luo et al. |
| 2015/0132949 | A1 | 5/2015 | Lin et al. |
| 2015/0372176 | A1 | 12/2015 | Topping |
| 2016/0064583 | A1 | 3/2016 | Smith et al. |

FOREIGN PATENT DOCUMENTS

| | | |
|---|---|---|
| EP | 1427026 | 6/2004 |
| EP | 2256820 | 12/2010 |
| GB | 2210462 | 6/1989 |
| JP | S6135573 | 2/1986 |
| JP | 2010529599 | 8/2000 |
| JP | 2012049542 | 3/2012 |
| WO | 2002059981 | 8/2002 |
| WO | 2007124725 | 11/2007 |
| WO | 2011034908 | 3/2011 |
| WO | 2012175902 | 12/2012 |
| WO | 2014118545 | 8/2014 |
| WO | 2015145166 | 10/2015 |
| WO | 2017174996 | 10/2017 |
| WO | 2017174997 | 10/2017 |

OTHER PUBLICATIONS

International Search Report and Written Opinion dated Jun. 23, 2017 in International Application No. PCT/GB2017/050972 (10 pages).
International Search Report and Written Opinion dated Jun. 23, 2017 in International Application No. PCT/GB2017/050974 (11 pages).
Hezel R. "Novel back contact silicon solar cells designed for very high efficiencies and low-cost mass production," Conference Record of the 29th IEEE Photovoltaic Specialists Conference 2002, vol. 29, May 19, 2002-May 24, 2002, pp. 114-117.
Sturm et al. "Chemical Vapor Deposition Epitaxy of Silicon-based Materials using Neopentasilane," ECS Transactions, 2008, 16(10), 799-805.
Wronski "Schottky-barrier characteristics of metal-amorphous-silicon diodes," Applied Physics Letters, 1975, 29(9), 1.
Search Report under Section 17(5), issued in GB1605916.4, dated Sep. 13, 2016.
Kilmova et al. "High-Voltage Photovoltaic Cells with Alloyed Aluminum Contacts." Applied Solar Energy, 1992, 28(3), 20-24.
Examination Report issued in GB1605916.4, dated Sep. 6, 2019.

* cited by examiner

APERTURE IN A SEMICONDUCTOR

The present invention relates to an optoelectronic device and more specifically a solar photovoltaic cell.

The term photovoltaic refers to the production of electricity, normally direct electrical current, from light at the junction between two materials that are exposed to the light. The light is normally sunlight and therefore photovoltaic is often referred to as solar photovoltaic. It is known to use semiconductors for the two materials. The semiconductor materials used exhibit a photovoltaic effect.

The two semiconductors are usually a p-type and an n-type semiconductor material. When joined together the boundary or interface between the two types of semiconductor material is referred to as a p-n junction. This type of p-n junction is usually created by doping one material with the other material. The doping may be by diffusion, ion implantation or epitaxy.

A p-n junction can be found in most optoelectronic devices that use semiconductors. These optoelectronic devices include photovoltaic or solar photovoltaic cells, diodes, light-emitting diodes (LEDs) and transistors. The p-n junction can be thought of as the active site where the generation or consumption of electrical energy occurs.

The demand for sources of renewable energy has driven significant improvements in the cost and efficiency of solar photovoltaic cells but existing technology still represents a relatively expensive method of generating electricity. Also, existing solar photovoltaic cells are relatively inefficient compared to other methods of generating electricity and are relatively fragile, that is they are relatively easily damaged.

The present invention aims to mitigate one or more of the disadvantages of existing solar photovoltaic cells.

In accordance with a first aspect of the present invention there is provided an optoelectronic device comprising:
- a substrate comprising a groove having a first and a second face;
- the first face of the groove coated with a conductor material and the second face of the groove coated with a semiconductor material;
- the conductor material and the semiconductor material in contact with another semiconductor material in the groove; and
- wherein there is an aperture in the another semiconductor material.

It may be an advantage of the present invention that the aperture makes the optoelectronic device less susceptible to shorting and/or shunting across the groove. The aperture in the another semiconductor material typically increases the length of a charge transfer path/route across the top of the groove and this makes the optoelectronic device less susceptible to shunting.

Shunting is a parasitic parallel resistance across the optoelectronic device. Maximising shunt resistance makes the optoelectronic device more efficient. A higher shunting resistance reduces the occurrence of shunting. The aperture in the another semiconductor material typically minimises the structural shunting effects and this reduces the deleterious effect of shunting on the optoelectronic device.

Shunting also typically includes counter-electromotive forces EMF or CEMF. These back electromotive forces are the electromotive forces or voltage that push against the desired current which is generated on the face coated with the semiconductor.

This electrical pathway or connection will typically produce two diodes in opposite directions. One diode will typically have a greater, normally much greater, area and this diode will normally dominate the function of the device. This may be due in part to its relative size and in part to the possible path through the conductor material.

The another semiconductor material typically has a first surface substantially parallel to the first face of the groove and a second surface substantially parallel to the second face of the groove, the first and second surfaces defining the aperture in the another semiconductor material.

The first face of the groove and a first surface of the substrate adjacent the groove typically make up a first side of the groove. The second face of the groove and a second surface of the substrate adjacent the groove typically make up a second side of the groove. The first and second surfaces adjacent the groove are typically at least substantially parallel with and/or in the same plane as the substrate. The first and second side of the groove are typically on the same surface of the substrate.

The first and second sides of the groove may each be coated with the conductor material and the semiconductor material.

The first face, second face, the conductor material and the semiconductor material are typically all in contact with the another semiconductor material in the groove.

The first surface of the another semiconductor may be parallel at least in part to the first face of the groove and the second surface of the another semiconductor may be parallel at least in part to the second face of the groove.

The aperture may be referred to as a gap and/or crack. The shape of the aperture is typically substantially conformal with the shape of the groove. The shape of the aperture may match the shape of the groove.

The first and second surfaces of the another semiconductor may be referred to as sides of the aperture. The sides of the aperture may be substantially parallel to the first and second faces of the groove respectively. The sides of the aperture may be steeper or shallower than the first and/or second faces of the groove but are still be considered substantially parallel.

The first and the second face of the groove typically define a cavity of the groove therebetween. The aperture normally extends down into the cavity. The aperture typically extends down into the cavity between the first and second face of the groove.

The another semiconductor material may occupy from 15 to 75%, optionally from 20 to 50% of the volume of the cavity of the groove. When for example the another semiconductor material occupies from 20 to 50% of the volume of the cavity, a remaining 70 to 40% corresponds to the aperture in the another semiconductor material. The conductor material and semiconductor material account for the remaining volume. The volume of the cavity occupied by the another semiconductor material may be related to the shape of the groove.

The aperture in the another semiconductor material may extend up to 90%, optionally from 20 to 80% and typically from 50 to 80% of the distance into the cavity of the groove. It may be an advantage of the present invention that a crack in the semiconductor material that extends about 50% of the distance into the cavity from the top of the cavity may increase the electrical current generated by the optoelectronic device. The distance the crack in the semiconductor material extends into the cavity from the top of the cavity may be related to the shape of the groove.

The conductor material may coat and/or cover from 20 to 80%, normally from 40 to 60% and typically about 50% of the first face of the groove. The conductor material may coat and/or cover about 75% of the first face of the groove. The semiconductor material may coat and/or cover from 20 to 80%, normally from 40 to 60% and typically about 50% of the second face of the groove. The semiconductor material may coat and/or cover about 75% of the second face of the groove.

It may be an advantage of the present invention that when the conductor material and/or semiconductor material coats and/or covers about 50%, preferably about 75%, of the first face and/or second face of the groove respectively, one or more of the efficiency, electrical current generated, power output and photoelectric conversion efficiency of the optoelectronic device is increased.

The another semiconductor in the groove may be, and/or may be referred to as, coated on the first and second face of the groove. The coat of the another semiconductor material may be from 50 nm to 1000 nm thick, normally from 100 nm to 500 nm thick and typically from 100 to 200 nm thick. The coat of the another semiconductor material may therefore be referred to as a relatively thin coating.

It may be an advantage of the present invention that when the another semiconductor thickness is about 200 nm, one or more of the efficiency, electrical current generated, power output and photoelectric conversion efficiency of the optoelectronic device is increased. When the another semiconductor thickness is about 200 nm, the width of the groove may be about 1 µm, although this may vary for different groove shapes. One or more of the efficiency, electrical current generated, power output and photoelectric conversion efficiency of the optoelectronic device may be increased further if the thickness of the another semiconductor is about 200 nm thick and the conductor material and/or semiconductor material coats and/or covers about 50% of the first face and/or second face of the groove respectively, when the groove is v-shaped, 1 µm deep and 1 µm wide. One or more of the efficiency, electrical current generated, power output and photoelectric conversion efficiency of the optoelectronic device may be yet further increased if the another semiconductor material occupies about 40% of the volume of the cavity of the groove and the conductor material and/or semiconductor material coats and/or covers about 50% of the first face and/or second face of the groove respectively.

Increasing one or more of the efficiency, electrical current generated, power output and photoelectric conversion efficiency may reduce the overall cost of the optoelectronic device.

The applicant notes that the advantage provided by a relatively thin coating of the another semi-conductor is counterintuitive, as a thinner coating would be expected to increase the path length of any charge transfer and thereby reduce the photoelectric conversion efficiency of the optoelectronic device. In contrast, the thinner coating corresponds with an increase in the effective current in the groove and thereby increases the photoelectric conversion efficiency of the optoelectronic device.

The first and second faces of the groove may each have a first and a second end. The first ends are typically in contact at a bottom of the cavity, the second ends detached at a top of the cavity. The another semiconductor is typically discontinuous, normally substantially discontinuous between the second end of the first face of the groove and the second end of the second face of the groove.

The first face of the groove will typically be coated with the another semiconductor where the conductor does not coat the first face of the groove. The second face of the groove will typically be coated with the another semiconductor where the semiconductor does not coat the second face of the groove.

The coat of the another semiconductor is typically substantially the same thickness across the first face of the groove, second face of the groove, conductor material and semiconductor material. The coat of the another semiconductor typically has a uniform thickness.

The groove may be any shape. The groove may be v-shaped, rounded or square. The cavity may have a flat bottom.

The substrate may comprise a first and a second series of grooves and a channel therebetween. The groove referred to above may be any one of the grooves of the first and/or second series of grooves. The channel typically transects the grooves of the first and second series of grooves.

It may be an advantage of the present invention that the channel separates the first and second series of grooves such that an electrical current can be taken from or supplied to the first series of grooves in isolation from the second series of grooves.

The first and second series of grooves are typically elongate grooves. The channel between the first and second series of grooves is typically an elongate channel.

The channel typically transects the grooves of the first and second series of grooves at or towards an end of each groove. The channel typically transects or crosses the grooves of the first series of grooves towards an end of each groove and then passes between the first and second series of grooves before transecting or crossing the grooves of the second series of grooves towards an opposite and/or opposing end of each groove.

The first face of the groove is normally at a first angle relative to a normal from the substrate and the second face of the groove is normally at a second angle relative to the normal from the substrate. The first angle is normally from 45 to less than or equal to 90°. The second angle is normally from 45 to less than or equal to 90°. The normal from the substrate is typically a line substantially parallel with the longitudinal axis or plane of the substrate.

The semiconductor material on the first surface of the substrate adjacent the groove and therefore on the first side of the groove may be coated with an insulator material. The insulator material is typically on top of the semiconductor material.

It may be an advantage of the present invention that the insulator material makes the optoelectronic device less susceptible to shorting and/or shunting across the groove. The insulator material normally insulates, typically electrically insulates, the semiconductor material on the first surface of the substrate adjacent the groove from the another semiconductor in the groove. The insulator material may increase the length of and/or mitigate a charge transfer path/route across the top of the groove and this typically makes the optoelectronic device less susceptible to shunting.

The insulator material is typically an electrical insulator material.

The semiconductor material is typically an n-type semiconductor material. The another semiconductor material is typically a p-type semiconductor material. In an alternative embodiment the semiconductor material is a p-type semiconductor material and the another semiconductor material is an n-type semiconductor material.

The n-type and p-type semiconductors may comprise one or more of silicon, amorphous silicon, hydrogenated amorphous silicon, aluminium, germanium, gallium nitride, gallium arsenide, aluminium phosphide, aluminium arsenide, copper iodide, zinc oxide, lead sulphide, selenium, boron phosphide, boron arsenide, gallium, indium nitride, indium phosphide, cadmium selenide, cadmium sulphide, cadmium telluride, zinc sulphide, zinc selenide, zinc telluride, copper chloride, copper sulphide, copper oxide, tin sulphide, tin telluride, zinc phosphide, titanium oxide, tin oxide, lithium niobate, lead iodide, gallium selenide, tin sulphide, iron oxide, nickel oxide, copper indium selenide, copper zinc tin sulphide, iron disulphide and copper zinc antimony sulphide.

The n-type semiconductor typically comprises one or more of silicon, germanium, phosphorus, selenium, tellurium, cadmium sulphide, zinc, indium, tin, oxides of the above and doped semiconducting oxides.

The p-type semiconductor typically comprises one or more of silicon, germanium, cadmium telluride, copper indium gallium selenide ('CIGS'), copper indium gallium diselenide, copper indium selenide (CIS), copper gallium selenide, copper oxide, boron, beryllium, zinc, cadmium, copper zinc tin sulphide (CZTS), perovskite, calcium titanium oxide, calcium titanate and lead sulphite.

The semiconductor and another semiconductor materials may meet at an interface and/or boundary. The interface is typically referred to as a p-n junction. The semiconductor and another semiconductor materials may together be referred to as an active material. The semiconductor and the another semiconductor are typically different materials.

The conductor material is typically ohmic and/or an ohmic contact to the another semiconductor material. The semiconductor material is typically rectifying and/or a rectifying contact to the another semiconductor material.

The active material may be deposited in the cavity and on the first and second face of the cavity and may provide ohmic and rectifying contacts for insertion or extraction of charge from the active material. The active material may be one or more of photovoltaic, light emitting and ion conducting.

The second face of the groove may be coated with a conductor material and the semiconductor material. The conductor material coated on the first face of the groove may be the same as the conductor material coated on the second face of the groove but it may be different. The conductor material coated on the first and/or second face may be an electrical conductor. The conductor material coated on the first and/or second face of the groove may comprise one or more of aluminium, bismuth, cadmium, chromium, copper, gallium, gold, indium, lead, magnesium, manganese, samarium, scandium, silver, tin, zinc, terbium, selenium, molybdenum, yttrium, holmium, calcium, nickel, tungsten, platinum, palladium and vanadium.

The another semiconductor material may be an electron blocking material such as molybdenum trioxide. The electron blocking material may be a hole transporting, electron blocking material, such as vanadium pentoxide, tantalum pentoxide, spiro-polymers, and p-dot polymers. The semiconductor material may be a heterojunction, that is a mixture of one or more of a p-type semiconductor, n-type semiconductor and donor acceptor material.

Normally a portion, normally a substantial portion, of the first and second series of grooves and channel therebetween are substantially parallel, typically parallel to one another. The channel may extend across the first and second series of grooves and typically across the end of the first and second series of grooves. The channel may extend across the first and second series of grooves and typically across opposing ends of the first and second series of grooves.

The channel may extend both perpendicular to and parallel to the first and second series of grooves. Normally the channel is perpendicular to the first and second series of grooves when it extends across the ends of the first and second series of grooves. Normally the channel is parallel to the first and second series of grooves when it extends between the first and second series of grooves. The angle at which the channel may extend across the ends of the first and second series of grooves can be variable and optionally be from 0 to 90°, normally from 35 to 55° and typically be 45°.

When the channel extends both perpendicular to and parallel to the first and second series of grooves, the channel may be referred to as running in at least two directions to connect said first and second series of grooves.

When the channel extends substantially perpendicular and across the ends of the first and second series of grooves, it may also extend in at least two directions relative to the first and second series of grooves. When the channel extends in at least two directions relative to the first and second series of grooves it typically forms a zigzag shape.

A surface of the substrate comprising the first and second series of grooves and a channel therebetween may be referred to as a structured surface. The structured surface is typically not flat. The substrate may have another surface that is flat.

The channel may be referred to as a delineation feature. The channel typically separates the first and second series of grooves. The channel typically has a first and a second face and a channel cavity therebetween. At least the first face of the channel may be coated with the conductor material and the second face of the channel may be coated with the semiconductor material. The second face of the channel may also be coated with the conductor material. The first and second faces of the channel are normally at least partially in contact with the another semiconductor material. The term 'in contact with' may include 'coated with'.

The first face of the channel is typically at a first angle relative to a normal from the substrate and the second face of the channel is typically at a second angle relative to a normal from the substrate. The first face of the channel and the second face of the channel may be perpendicular to the plane of the substrate. The first angle is normally from 45 to less than or equal to 90°. The second angle is normally from 45 to less than or equal to 90°.

There is usually no electrical communication between the conductor material on the first face of the channel, semiconductor material on the second face of the channel and the another semiconductor material on the first and second faces of the channel.

A first side and a second side of the channel may provide the positive and negative poles of an electrical circuit. The first and second sides may be in electrical communication with the conductor material on the first and second faces of the channel respectively. The first side of the channel may be in electrical communication, typically attached to, the positive pole of the electrical circuit. The second side of the channel may be in electrical communication, typically attached to, the negative pole of the electrical circuit.

The first and second sides of the channel may be adjacent to the channel. The first and second sides of the channel may be at least substantially parallel to the plane of the substrate.

The channel is typically non-conductive. The channel typically separates and/or insulates the first and second sides of the channel from one another.

The optoelectronic device may be referred to as a two terminal device. The first and second series of grooves may be referred to as cascaded groove structures. In use the device may be fabricated in a series arrangement and operated in a parallel or a combined series and parallel arrangement.

The channel cavity between the first and second faces of the channel may be any shape and is normally U-shaped, V-shaped or semi-spherical. The channel cavity between the first and second faces of the channel may have a flat bottom. The shape of the cavity between the first and second faces of the first and second series of grooves may be the same or different to the shape of the channel cavity between the first and second faces of the channel.

The bottom of the channel cavity may be flat or may be rutted. The rutted bottom of the channel cavity may be referred to as uneven or rough. The rutted bottom of the channel cavity typically increases the surface area of the bottom of the channel cavity. Increasing the surface area of the bottom of the channel cavity may help to ensure the channel separates and/or insulates the first and second sides of the channel from one another.

The channel and grooves of the first and second series of grooves typically have a depth measured from an upper surface of the substrate to a point in the channel or groove furthest from the upper surface.

The depth of the channel is typically greater than the depth of the grooves of the first and second series of grooves. The depth of the channel may be at least twice the depth of the grooves of the first and second series of grooves.

The channel has a depth and a width. The depth of the channel is typically twice the width of the channel. The aspect ratio for the depth to the width of the channel is therefore typically about 2:1.

The first and second series of grooves typically form a series of ridges and cavities. The first and second series of grooves may comprise at least 2 cavities, typically from 2 to 500 cavities.

Each of the grooves of the first and second series of grooves is typically from 5 to 200 mm long, normally from 5 to 1000 mm long and preferably 330 mm long. Each of the grooves of the first and second series of grooves is typically from 0.3 to 100 μm wide, normally from 0.3 to 5 μm wide.

The substrate may comprise a curable resin and in particular a UV curable resin. The substrate may comprise one or more of an acrylic resin coated onto polyvinyl chloride (PVC), acrylic resin coated onto polyethylene terephthalate (PET), acrylic resin coated onto polyethylene naphthalate (PEN), a biopolymer coated onto polyvinyl chloride (PVC), a biopolymer coated onto polyethylene terephthalate (PET) and a biopolymer coated onto polyethylene naphthalate (PEN).

The first and second series of cascaded groove structures may comprise the substrate.

The optoelectronic device is typically a solar photovoltaic cell.

The optoelectronic device may be one or more of attached, secured and applied to a vehicle, for example a car or lorry, a house, for example a roof, and any other surface of a permanent structure. The permanent structure may be man-made or natural.

A surface that the optoelectronic device is one or more of attached, secured and applied to may be flat or uneven, that is one or more of rough, bumpy, irregular and/or rutted.

Embodiments of the invention will now be described by way of example only and with reference to the accompanying drawings, in which.

Figure 1A:
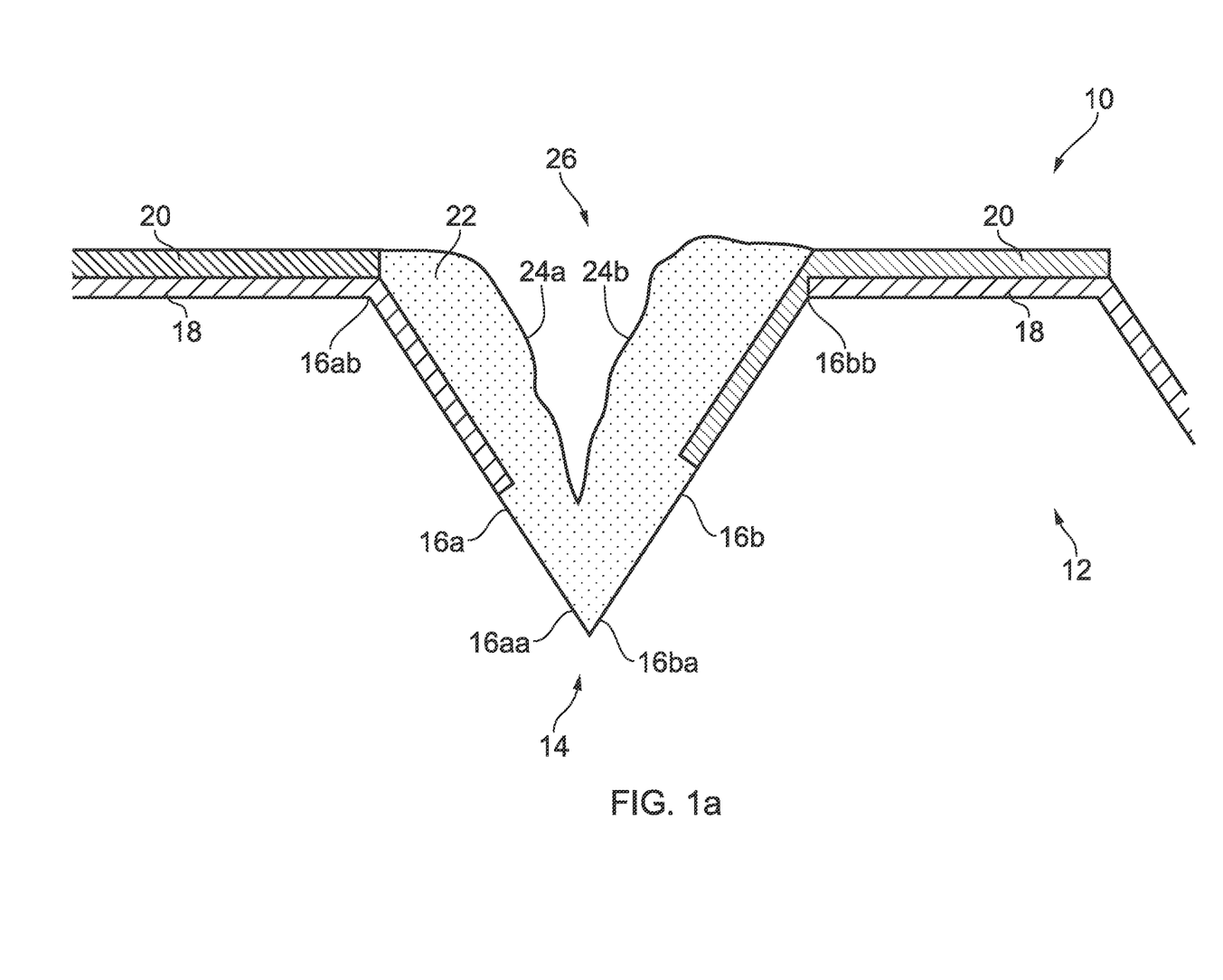
FIG. 1a is a cross-sectional view of a groove of an optoelectronic device according to a first embodiment of the present invention.

FIG. 1a shows an optoelectronic device 10 comprising a substrate 12 comprising a groove 14 having a first 16a and a second 16b face. The first face 16a of the groove is coated with a conductor material 18 and the second face 16b of the groove is coated with a semiconductor material 20. The conductor material 18 and semiconductor material 20 are in contact with another semiconductor material 22 in the groove. There is an aperture 26 in the another semiconductor material 22.

The first face 16a, second face 16b, conductor material 18 and semiconductor material 20 are in contact with the another semiconductor material 22. The another semiconductor 22 material has a first surface 24a substantially parallel to the first face 16a of the groove 14 and a second surface 24b substantially parallel to the second face 16b of the groove 14, the first and second surfaces 24a & 24b defining the aperture 26 in the another semiconductor material 22.

The aperture 26 in the another semiconductor material 22 increases the length of a charge transfer path across the top of the groove 14 and this makes the optoelectronic device 10 less susceptible to shunting.

The shape of the aperture 26 is conformal with the shape of the groove 14. The shape of the aperture 26 matches the shape of the groove 14.

The first 24a and second 24b surfaces of the another semiconductor are often referred to as sides of the aperture. In FIG. 1 the slope of the sides 24a & 24b of the aperture match the slope of the first and second faces 16a & 16b of the groove 14 respectively.

The first 16a and the second 16b face of the groove define a cavity of the groove 14 therebetween. FIG. 1 shows the aperture 26 extending down into the cavity between the first 16a and second 16b face of the groove 14. The another semiconductor material 22 occupies 75% of the volume of the cavity of the groove 14. A remaining 15% corresponds to the aperture 26 in the another semiconductor material 22. It is appreciated that the conductor material 18 and semiconductor material 20 occupy some of the cavity space and therefore account for some of the volume of the cavity not occupied by the another semiconductor material 22, although this volume is relatively small.

The aperture 26 in the another semiconductor material extends 50% of the distance into the cavity; the conductor material 18 coats 50% of the first face 16a of the groove 14; and the semiconductor material 20 coats 50% of the second face 16b of the groove 14. The efficiency of the optoelectronic device 10 is thereby increased compared to other % coatings.

The first face 16a of the groove 14 is in contact with the another semiconductor 22 where the conductor 18 does not coat the first face of the groove. The second face 16b of the groove 14 is in contact with the another semiconductor 22 where the semiconductor 20 does not coat the second face of the groove.

The another semiconductor 22 is substantially the same thickness across the first face 16a of the groove 14, second face 16b of the groove 14, conductor material 18 and semiconductor material 20.

The first 16a and second 16b faces of the groove 14 each have a first 16aa & 16ba and a second 16ab & 16bb end. The first ends 16aa & 16ba are in contact at a bottom of the cavity, the second ends 16ab & 16bb are detached at a top of the cavity. The another semiconductor 22 is discontinuous between the second end 16ab of the first face 16a of the groove 14 and the second end 16bb of the second face 16b of the groove 14.

The groove 14 is v-shaped.

Figure 1B:
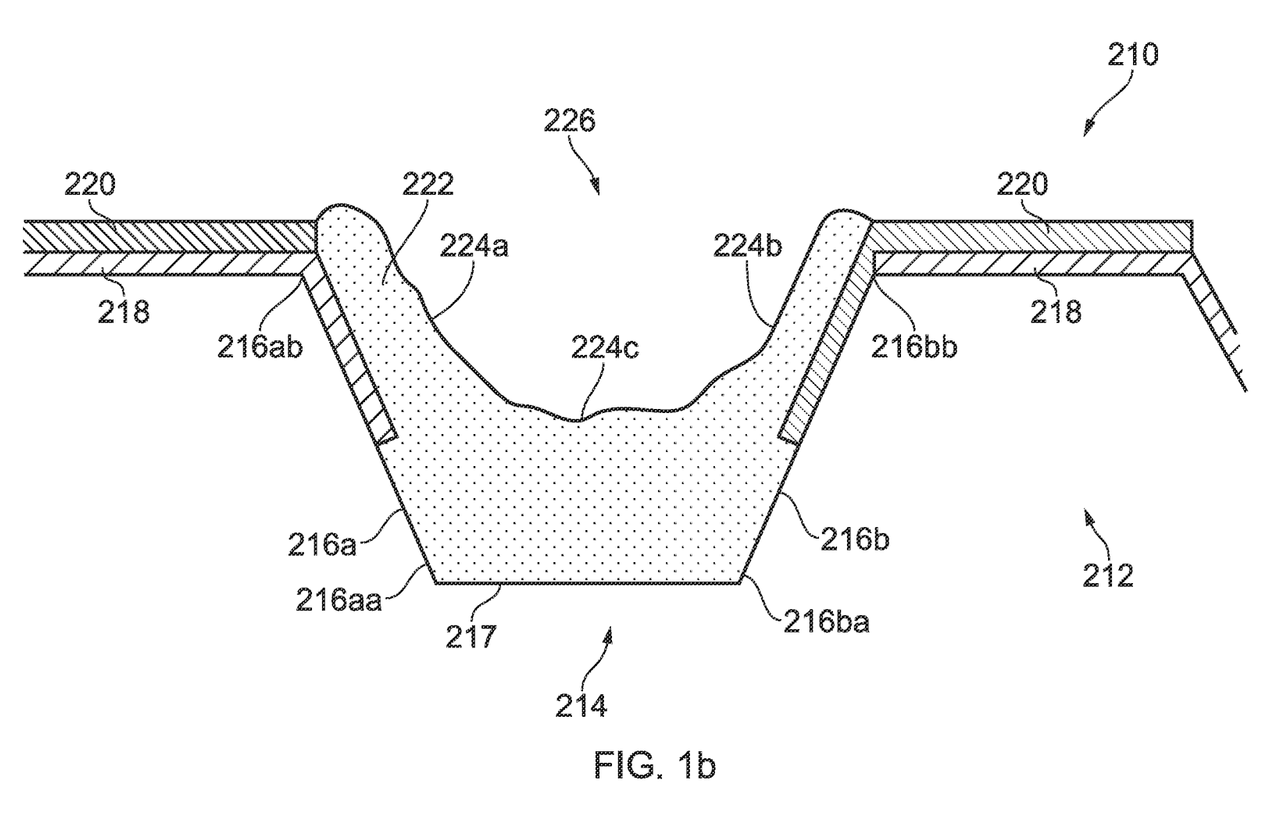
FIG. 1b is a cross-sectional view of a groove of an optoelectronic device according to a second embodiment of the present invention.

FIG. 1b shows a second embodiment of an optoelectronic device 210. Where the features are the same as the FIG. 1a embodiment, the reference numbers are the same except preceded by a "2". The optoelectronic device 210 comprises a substrate 212 comprising a groove 214. The groove 214 comprises a first 216a and second 216b face defining a cavity 226 of the groove 214 therebetween. The groove 214 further comprises a conductor material 218, a semiconductor material 220, and another semiconductor material 222. The first 216a and second 216b faces of the groove 214 each have a first 216aa & 216ba and a second 216ab & 216bb end.

The conductor material 218 and the semiconductor material 220 overlap on a portion of the substrate 212, such as between two individual grooves in a series of grooves. The cavity has a flat bottom 217 with which the first end 216aa & 216ba of the first 216a and second 216b faces respectively contact with. The another semiconductor material 222 has a first surface 224a substantially parallel to the first face 216a of the groove 214, a second surface 224b substantially parallel to the second face 216b of the groove 214, and a third surface 224c substantially parallel to the flat bottom 217 of the groove 214. The first, second and third surfaces 224a, 224b and 224c define an aperture 226. The shape of the aperture 226 matches the shape of the groove 214.

Figure 1C:
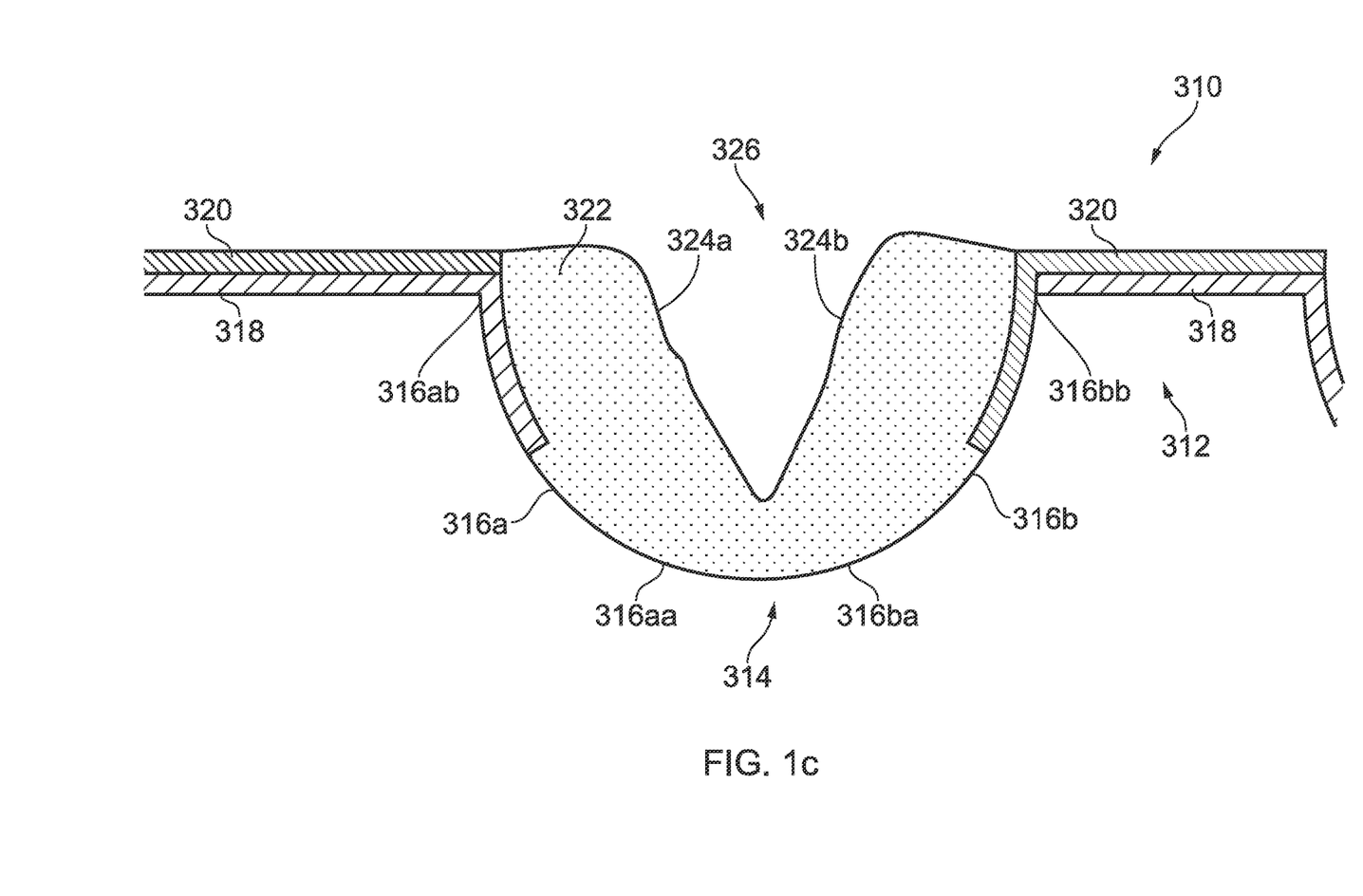
FIG. 1c is a cross-sectional view of a groove of an optoelectronic device according to a third embodiment of the present invention.

FIG. 1c shows a third embodiment of an optoelectronic device 310. Where the features are the same as previous embodiments, the reference numbers are the same except preceded by a "3". The optoelectronic device 310 comprises a substrate 312 comprising a groove 314. The groove 314 is rounded, and comprises a first face 316a, a second face 316b, a conductor material 318 and a semiconductor material 320, all in contact with another semiconductor material 322.

The conductor material 318 and the semiconductor material 320 overlap on a portion of the substrate 312, such as between two individual grooves in a series of grooves. The first 316a and second 316b faces of the groove 314 define a cavity. The another semiconductor material 322 comprises a first 324a and a second 324b surface which defines an aperture 326. The aperture 326 in the another semiconductor material 322 extends 75% of the distance into the cavity.

The first 316a and second 316b faces of the groove 314 each have a first 316aa & 316ba and a second 316ab & 316bb end. The slope of the surfaces 324a & 324b of the aperture 326 at the first ends 316aa & 316ba of the groove are steeper, that is they have a smaller angle relative to the longitudinal axis of the substrate 312, than the slope of the first 316a and second 316b faces of the groove 314, but the first 324a and second 324b surfaces of the aperture 326 are still overall substantially parallel to the first 316a and second 316b faces of the groove 314.

Figure 1D:
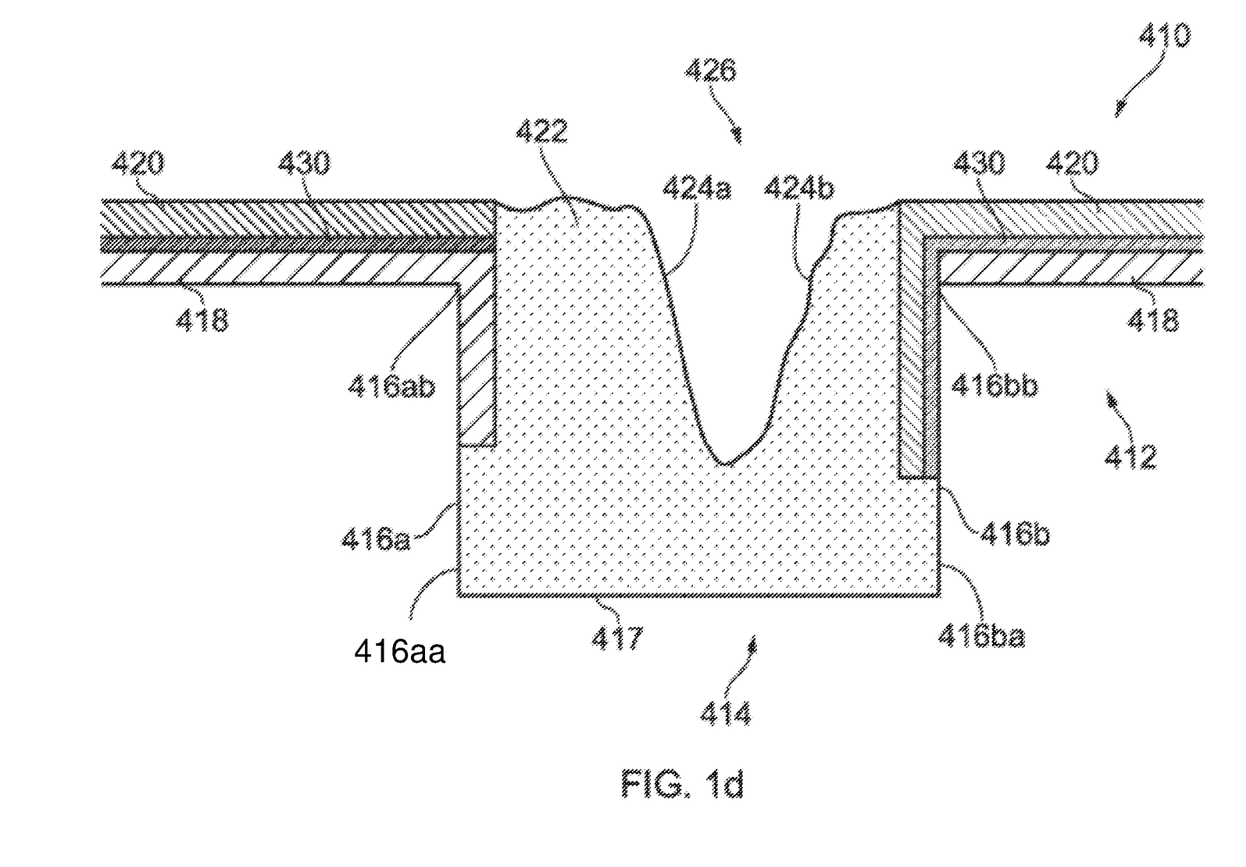
FIG. 1d is a cross-sectional view of a groove of an optoelectronic device according to a fourth embodiment of the present invention.

FIG. 1d shows a fourth embodiment of an optoelectronic device 410. Where the features are the same as previous embodiments, the reference numbers are the same except preceded by a "4". The optoelectronic device 410 comprises a substrate 412 comprising a groove 414. The groove 414 is square shaped, and as such the cavity has a flat bottom 417. The groove 414 comprises a first face 416a, a second face 416b, a conductor material 418 and a semiconductor material 420, all in contact with another semiconductor material 422.

The conductor material 418 and the semiconductor material 420 overlap in a portion of the substrate 412, such as between two individual grooves in a series of grooves. The optoelectronic device 410 further comprises an adhesion layer 430 comprising aluminium and/or chromium. The adhesion layer 430 may also be a conducting layer. The adhesion layer improves overall charge extraction from the device.

The another semiconductor material 422 comprises a first 424a and a second 424b surface which define an aperture 426. The aperture 426 is located slightly off-centre, that is the aperture 426 is located closer to the second face 416b of the groove 414 and farther from the first face 416a of the groove 414. The thickness of the another semiconductor 422 is thicker at the first face 416a of the groove 414 and thinner at the second face 416b of the groove 414. The first 416a and second 416b faces of the groove 414 are substantially vertical. The first 424a and second 424b surfaces of the aperture 426 are substantially parallel to the first 416a and second 416b faces of the groove 414. The aperture 426 is tapered in shape. The first 416a and second 416b faces of the groove 414 each have a first 416aa & 416ba and a second 416ab & 416bb end.

Figure 1E:
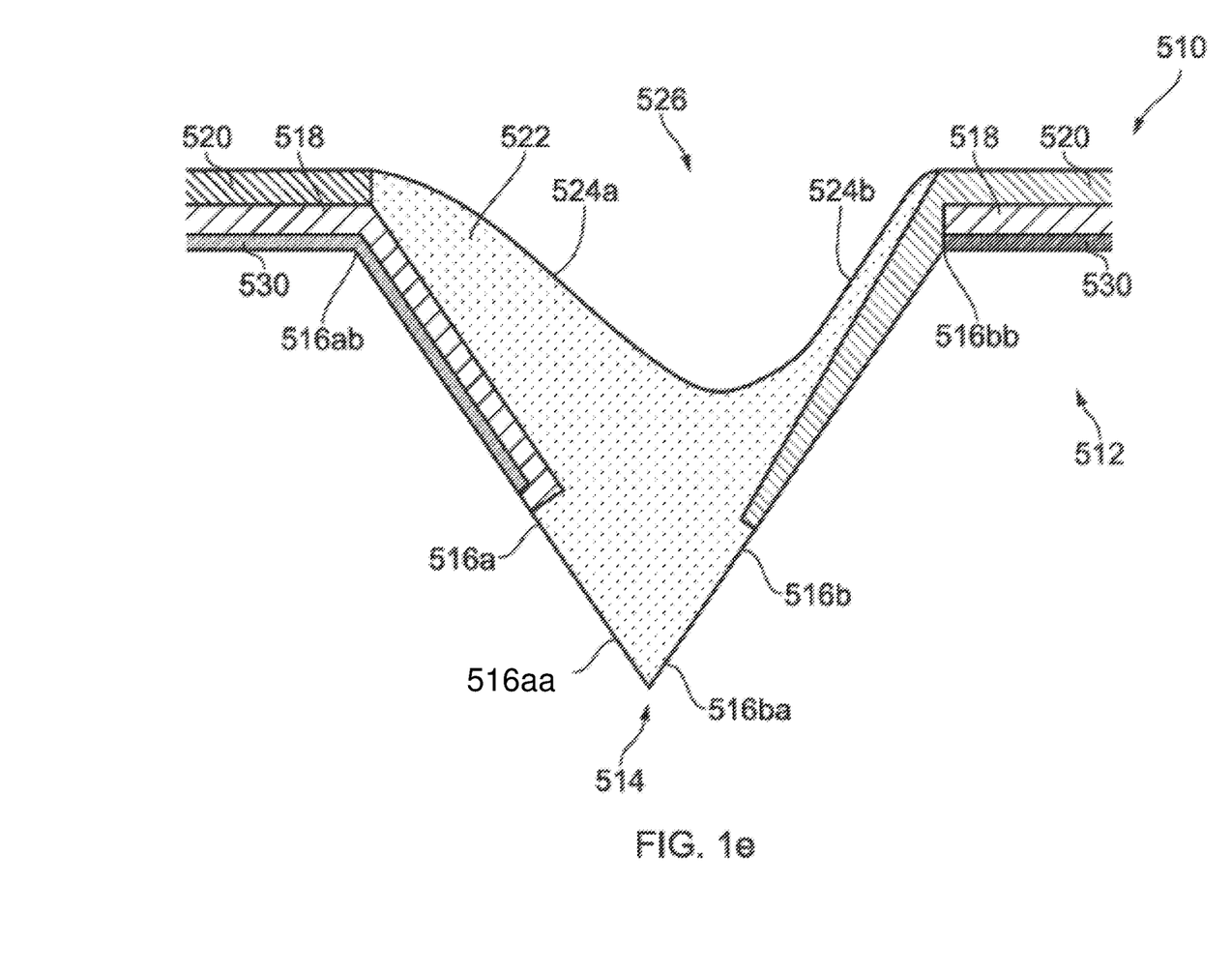
FIG. 1e is a cross-sectional view of a groove of an optoelectronic device according to a fifth embodiment of the present invention.

FIG. 1e shows a fifth embodiment of an optoelectronic device 510. Where the features are the same as previous embodiments, the reference numbers are the same except preceded by a "5". The optoelectronic device 510 comprises a substrate 512 comprising a groove 514. The groove 514 is v-shaped, and comprises a first face 516a, a second face 516b, a conductor material 518 and a semiconductor material 520, all in contact with another semiconductor material 522.

The conductor material 518 and the semiconductor material 520 overlap on a portion of the substrate 512, such as between two individual grooves in a series of grooves. The optoelectronic device 510 further comprises an adhesion layer 530 comprising aluminium and/or chromium, or other suitable material. The adhesion layer 530 may also be a conducting layer.

The first 516a and second 516b faces of the groove 514 define a cavity. The another semiconductor material 522 comprises a first 524a and a second 524b surface which defines an aperture 526. The aperture 526 in the another semiconductor material 522 extends 40% of the distance into the cavity. The groove 514 is symmetrical, but the aperture 526 in the another semiconductor material 522 is asymmetrical. The first surface 524a of the another semiconductor material 522 has a shallower slope, that is a lesser angle relative to the longitudinal axis of the substrate 512, than the second surface 524b of the another semiconductor material 522. The aperture 526 is located off-centre, that is the aperture 526 is located closer to the second face 516b of the groove 514 and farther from the first face 516a of the groove 514, such that the thickness of the another semiconductor 522 is thicker at the first face 516a of the groove 514 and thinner at the second face 516b of the groove 514.

The first 524a and second 524b surfaces of the aperture 526 are substantially parallel to the first 516a and second 516b faces respectively of the groove 514. The first 516a and second 516b faces of the groove 514 each have a first 516aa & 516ba and a second 516ab & 516bb end.

Figure 1F:
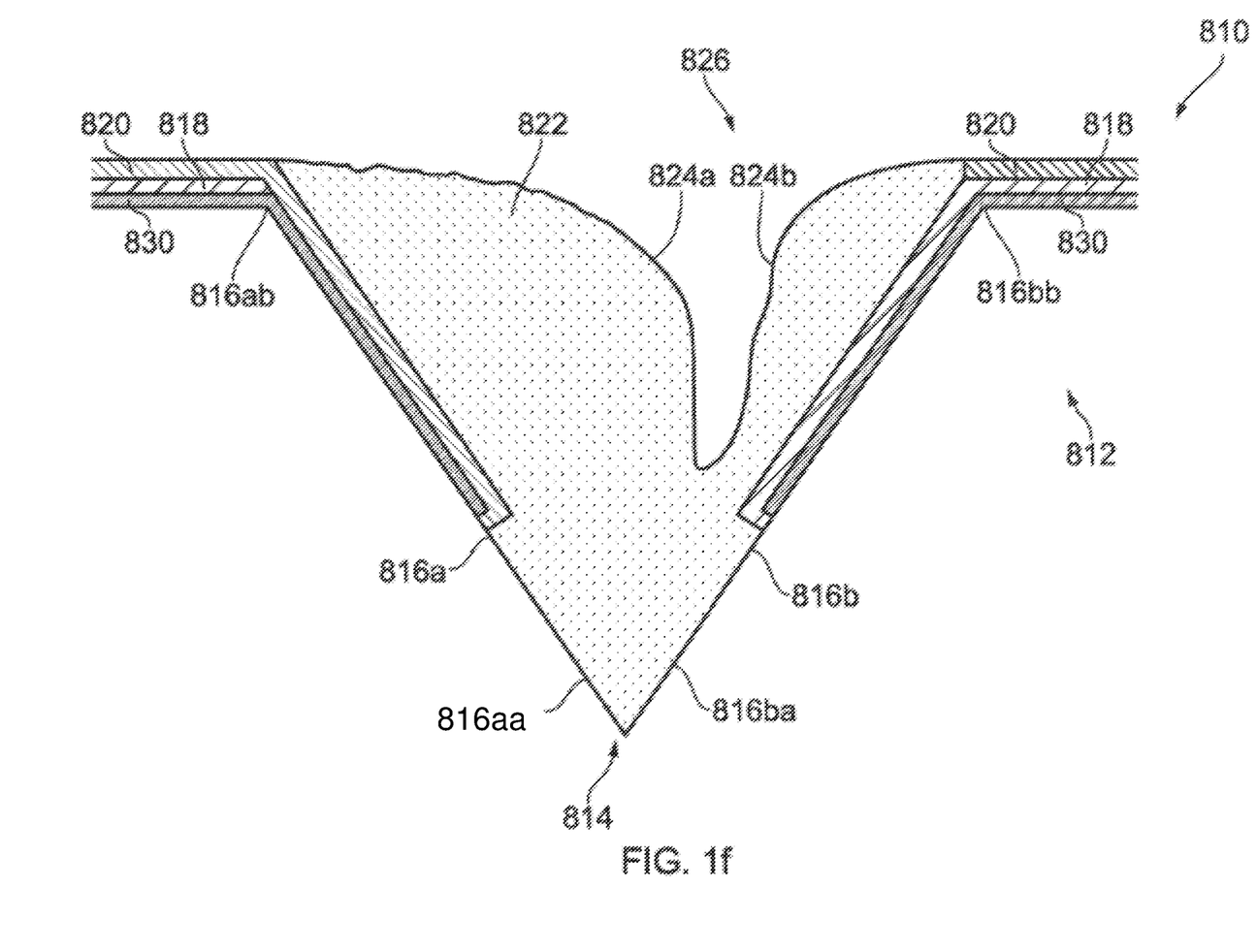
FIG. 1f is a cross-sectional view of a groove of an optoelectronic device according to a sixth embodiment of the present invention.

FIG. 1f shows a sixth embodiment of an optoelectronic device 810. Where the features are the same as previous embodiments, the reference numbers are the same except preceded by an "8". The FIG. 1f embodiment is similar to the FIG. 1a embodiment, such that the optoelectronic device 810 comprises a symmetrical v-shaped groove 814. The groove 814 comprises a first face 816a, a second face 816b, a conductor material 818 and a semiconductor material 820, all in contact with another semiconductor material 822. The first 816a and second 816b faces of the groove 814 each have a first 816aa & 816ba and a second 816ab & 816bb end.

The conductor material 818 and the semiconductor material 820 overlap on a portion of the substrate 812, such as between two individual grooves in a series of grooves. The optoelectronic device 810 further comprises an adhesion layer 830 comprising aluminium and/or chromium, or other suitable material, such as $SiO_x$ which is an insulating layer shown to improve adhesion. The adhesion layer 830 may also be a conducting layer.

The another semiconductor 822 material has a first surface 824a substantially parallel to the first face 816a of the groove 814 and a second surface 824b substantially parallel to the second face 816b of the groove 814. The aperture 826 is located off-centre, that is the aperture 826 is located closer to the second face 816b of the groove 814 and farther from the first face 816a of the groove 814, such that the thickness of the another semiconductor 822 is thicker at the first face 816a of the groove 814 and thinner at the second face 816b of the groove 814.

Figure 1G:
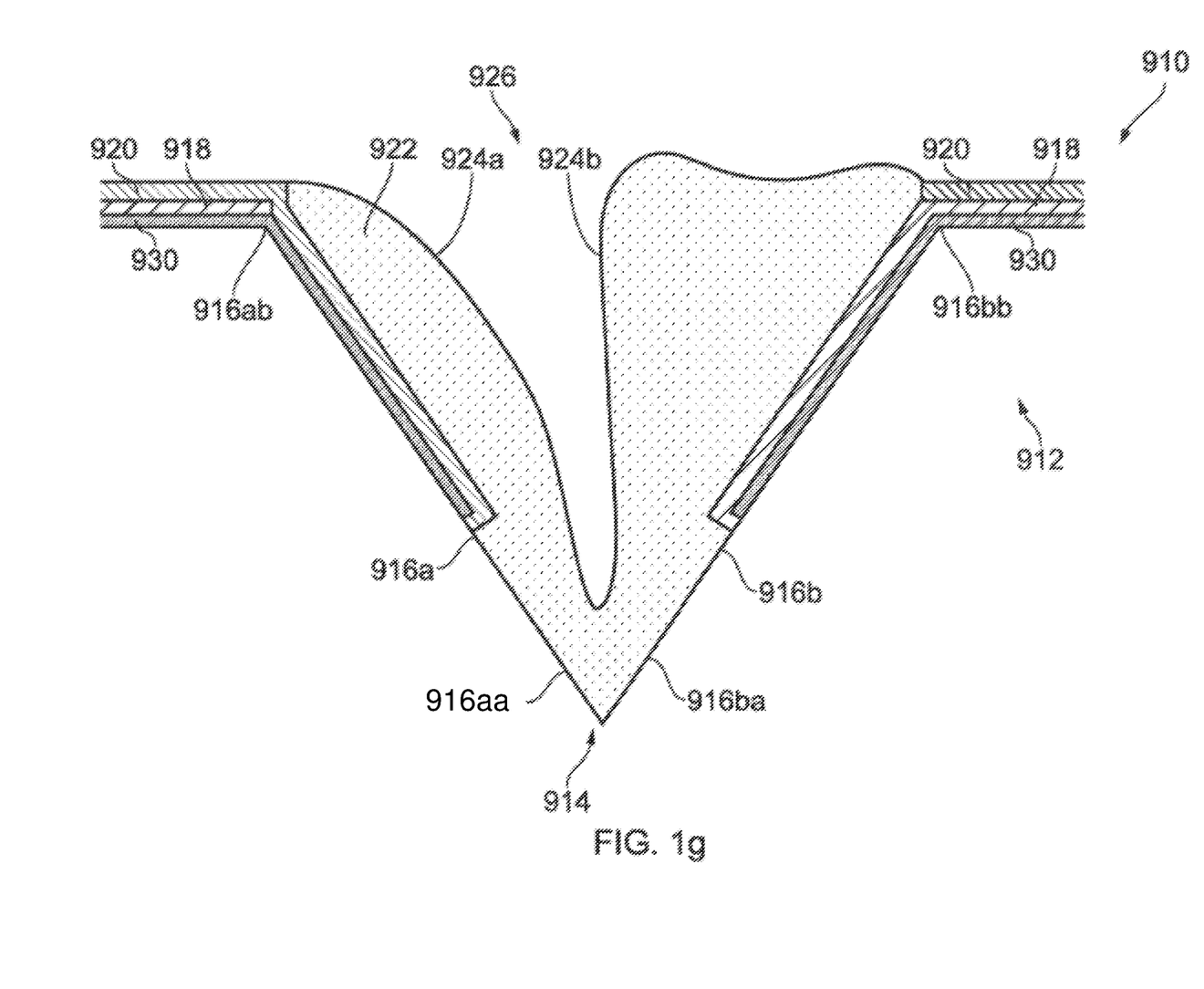
FIG. 1g is a cross-sectional view of a groove of an optoelectronic device according to an seventh embodiment of the present invention.

FIG. 1g shows a seventh embodiment of an optoelectronic device 910. Where the features are the same as previous embodiments, the reference numbers are the same except preceded by a "9". The FIG. 1g embodiment is similar to the FIG. 1f embodiment, such that the optoelectronic device 910 comprises a symmetrical v-shaped groove 914. The groove 914 comprises a first face 916a, a second face 916b, a conductor material 918 and a semiconductor material 920, all in contact with another semiconductor material 922. The first 916a and second 916b faces of the groove 914 each have a first 916aa & 916ba and a second 916ab & 916bb end.

The conductor material 918 and the semiconductor material 920 overlap on a portion of the substrate 912, such as between two individual grooves in a series of grooves. The optoelectronic device 910 further comprises an adhesion layer 930 comprising aluminium and/or chromium. The adhesion layer 930 may also be a conducting layer.

The first 916a and second 916b faces of the groove 914 define a cavity. The another semiconductor 922 material has a first surface 924a substantially parallel to the first face 916a of the groove 914 and a second surface 924b substantially parallel to the second face 916b of the groove 914. The aperture 926 is located off-centre, that is the aperture 926 is located closer to the first face 916a of the groove 914 and farther from the second face 916b of the groove 914, such that the thickness of the another semiconductor 922 is thicker at the second face 916b of the groove 914 and thinner at the first face 916a of the groove 914. The aperture 926 in the another semiconductor material 922 extends 80% of the distance into the cavity.

Figure 1H:
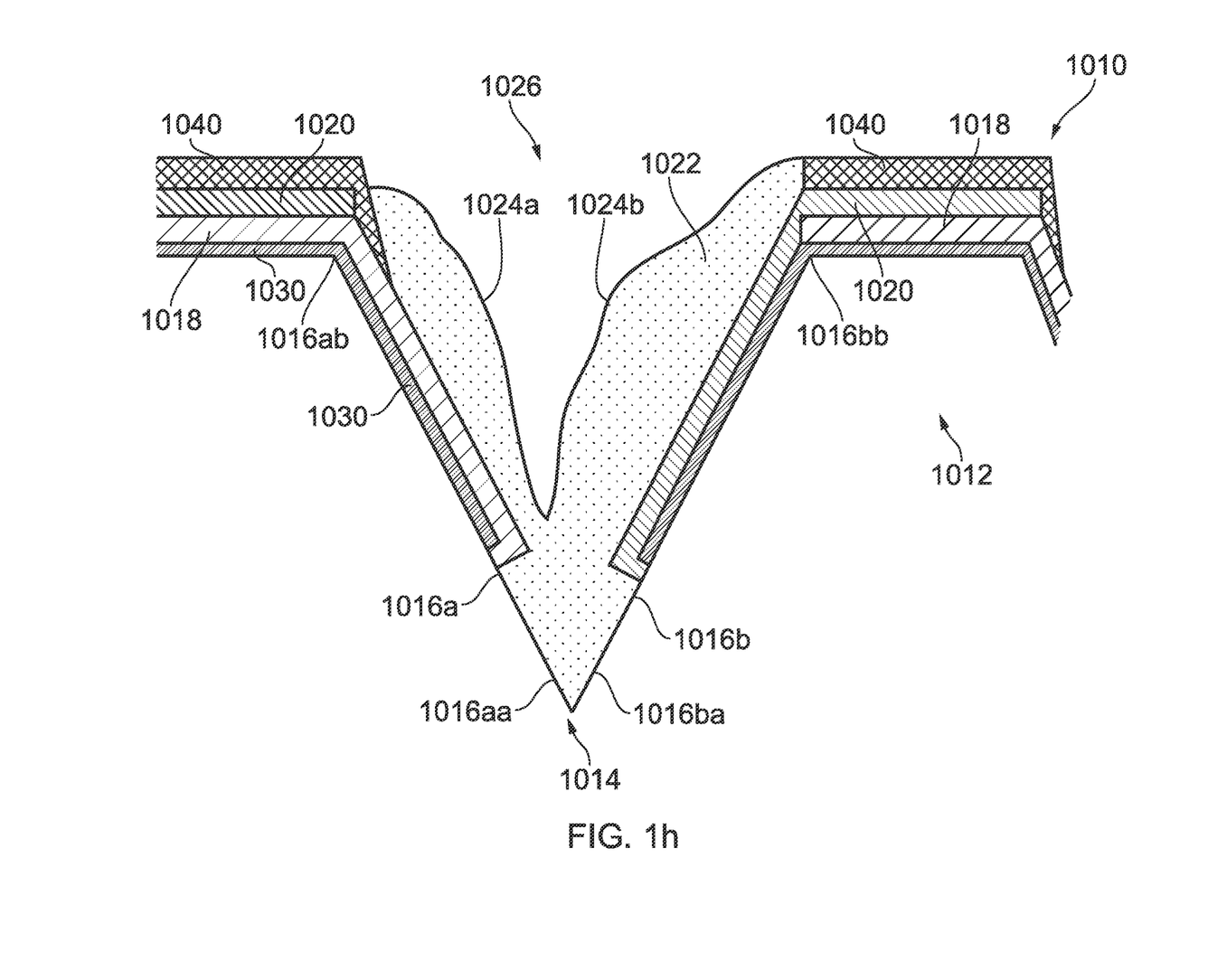
FIG. 1h is a cross-sectional view of a groove of an optoelectronic device according to an eighth embodiment of the present invention.

FIG. 1h shows an eighth embodiment of an optoelectronic device 1010. Where the features are the same as previous embodiments, the reference numbers are the same except preceded by a "10". The optoelectronic device 1010 comprises a substrate 1012 comprising a groove 1014. The groove 1014 is v-shaped, and comprises a first face 1016a, a second face 1016b, a conductor material 1018 and a semiconductor material 1020, all in contact with another semiconductor material 1022. The first 1016a and second 1016b faces of the groove 1014 each have a first 1016aa & 1016ba and a second 1016ab & 1016bb end.

The first 1016a and second 1016b faces of the groove 1014 define a cavity. The another semiconductor 1022 material has a first surface 1024a substantially parallel to the first face 1016a of the groove 1014 and a second surface 1024b substantially parallel to the second face 1016b of the groove 1014, the first surface 1024a and the second surface 1024b defining an aperture 1026.

The semiconductor material 1020 on the first surface of the substrate adjacent the groove 1014 and therefore on the first side of the groove is coated with an insulator material 1040. The insulator material 1040 is on top of the semiconductor material 1020 on the first surface of the substrate. The optoelectronic device 1010 further comprises an adhesion layer 1030.

The first face of the groove 1016a and a first surface of the substrate adjacent the groove 1014 make up the first side of the groove.

The insulator material is an electrical insulator material. The insulator material electrically insulates the semiconductor material 1020 on the first surface of the substrate adjacent the groove from the another semiconductor 1022 in the groove 2014.

Figure 2:
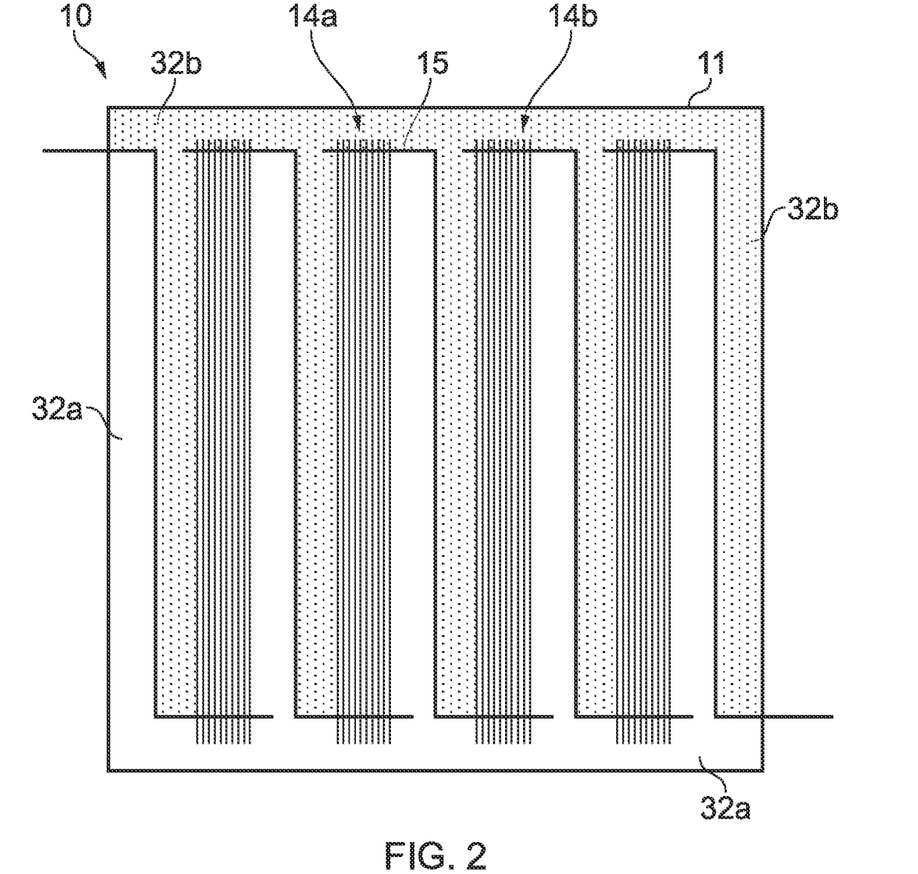
FIG. 2 is a plan view of the optoelectronic device.

FIG. 2 shows a plan view of the optoelectronic device 10 comprising a substrate 11 having a surface comprising a first 14a and a second 14b series of grooves and a channel 15 therebetween.

The optoelectronic device 10 is a solar photovoltaic cell. The optoelectronic device 10 includes a mixture of inter-digitated (parallel connected) and cascaded (series connected) grooves 14.

The channel 15 is a means to separate but also connect the cascaded (series connected) grooves 14a & 14b in parallel, in order to make it possible to extract the desired electric charge generated at the voltage designed by the number of cascaded groove structures 14a & 14b.

A first area 32a carries a positive charge and a second area 32b carries a negative charge.

Figure 3:
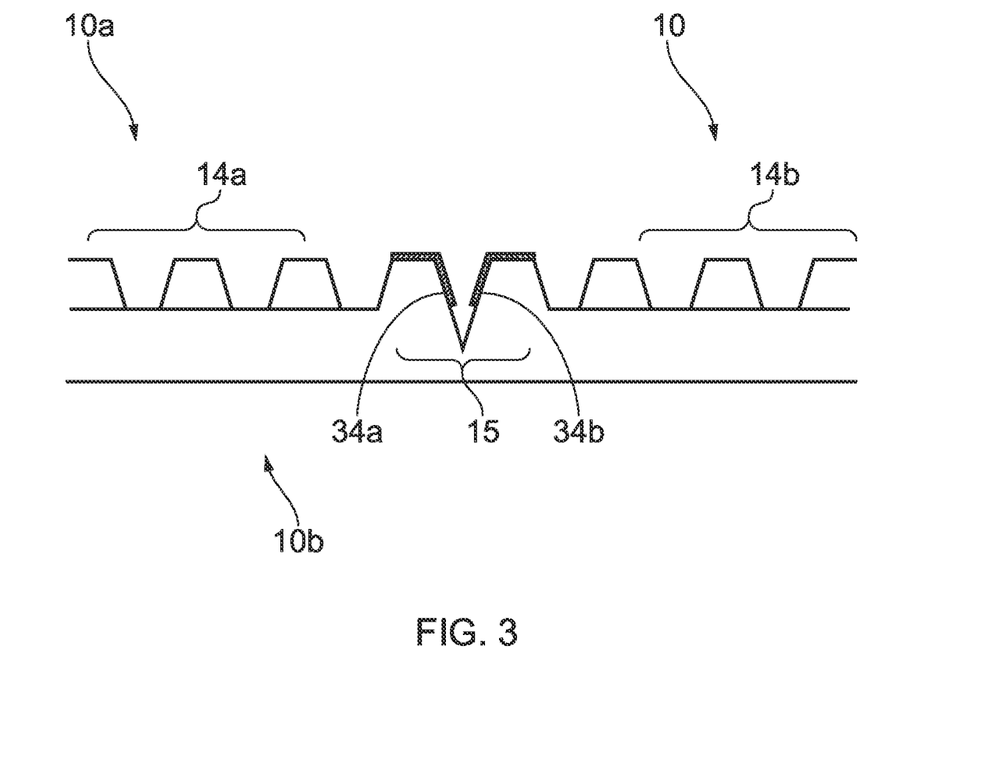
FIG. 3 is a cross-sectional view of the grooves and channel of the optoelectronic device.

FIG. 3 shows a cross-sectional view of the optoelectronic device 10. The optoelectronic device 10 has a structured surface 10a and a flat surface 10b. The first 14a and second 14b series of cascaded groove structures lie either side of the delineation feature 15. The delineation feature 15 represents an inactive area of the optoelectronic device 10.

Charge extraction conductors 34a & 34b of the delineation feature 15 form input and output connections to the semiconductor material (not shown) in the cavities of the cascaded groove structures 14a & 14b.

The optoelectronic device 10 may be made in various different ways using different techniques and process steps. One way to make the optoelectronic device 10 is to use an off-axis directional coating process to apply the coat of conductor material 18, semiconductor material 20, and another semiconductor material 22 to the substrate 12 comprising the groove 14.

The off-axis directional coating process may include spraying the conductor material 18, semiconductor material 20, and another semiconductor material 22 at an angle relative to the plane of the substrate, and therefore also the groove, such that only the first 16*a* or second 16*b* face of the groove 14 is coated. This is typically because the coating is substantially restricted by viewing angle to only one of the first or second face.

The off-axis directional coating process may include using a shield to restrict the coating of the conductor material 18, semiconductor material 20 or another semiconductor material 22 onto the at least first 16*a* and/or second 16*b* face of the groove 14.

The off-axis directional coating process may be repeated using more than one conductor material 20, semiconductor material 22 and/or another semiconductor material 22.

The another semiconductor 22 material having a first surface 24*a* substantially parallel to the first face 16*a* of the groove 14 and a second surface 24*b* substantially parallel to the second face 16*b* of the groove 14, is applied to the substrate 12 using an ultrasonic spray coating process such that the first and second surfaces 24*a* &24*b* define an aperture 26 in the another semiconductor 22. The another semiconductor 22 material is applied in multiple conformal thin coatings. Thin is understood to mean less than or equal to about 20% of the final coating thickness.

The substrate 12 is a structured surface and is produced by patterning a surface of the substrate.

The off-axis directional coating requires that the coating occurs from an angle relative to the groove 14. The coating is sprayed into the groove 14 and deposited from either side of a vertical axis. The off-axis directional coating is performed in a partial vacuum. The partial vacuum ensures the coating material from the source has a sufficient mean free path, that is a direct and un-diverted path, and that the substrate is substantially free from interactions with gas or atmospheric molecules.

Spray may refer to any type of directional coating of individual elements and/or droplets, the dimensions of which are smaller than or at least comparable to the dimensions of the groove.

The off-axis directional coating means that the coating of the various materials is substantially restricted by viewing angle to only one side of the groove 14. The acceptable limits of off-axis directional coating are defined by the type of structure and/or substrate onto which the coating is deposited. The coatings are discontinuous over a surface of the structure and/or substrate because of the fine structure or type of structure or substrate used.

The process of off-axis directional coating is further described in WO 2012/175902A1. The process of off-axis directional coating may be referred to as Glancing Angle Deposition (GLAD).

Modifications and improvements can be incorporated herein without departing from the scope of the invention.

The invention claimed is:

1. An optoelectronic device comprising:
    a substrate comprising a groove having a first face and a second face;
    wherein the first face of the groove is partially coated with a conductor material and the second face of the groove is partially coated with a first semiconductor material;
    wherein the groove is partially filled with a second semiconductor material such that the first face, the second face, the conductor material, and the first semiconductor material are all in contact with the second semiconductor material in the groove;
    wherein the groove has a volume and the second semiconductor material occupies from 50 to 75% of the volume of the groove; and
    wherein there is a crack in the second semiconductor material.

2. The optoelectronic device according to claim 1, wherein the second semiconductor material has a first surface substantially parallel to the first face of the groove and a second surface substantially parallel to the second face of the groove, such that the first surface and the second surface define the crack in the second semiconductor material.

3. The optoelectronic device according to claim 1, wherein the first face of the groove and a first surface of the substrate adjacent the groove make up a first side of the groove, the second face of the groove and a second surface of the substrate adjacent the groove make up a second side of the groove, and the first surface adjacent the groove and the second surface adjacent the groove are at least substantially parallel with and in the same plane as the substrate.

4. The optoelectronic device according to claim 3, wherein the first side of the groove and the second side of the groove are each coated with the conductor material and the first semiconductor material.

5. The optoelectronic device according to claim 1, wherein the groove has a shape, the crack has a shape, and the shape of the crack is substantially conformal with the shape of the groove.

6. The optoelectronic device according to claim 1, wherein the groove has a depth and the crack in the second semiconductor material extends from 20 to 80% into the depth of the groove.

7. The optoelectronic device according to claim 1, wherein the conductor material covers from 40 to 60% of the first face of the groove.

8. The optoelectronic device according to claim 1, wherein the first semiconductor material covers from 40 to 60% of the second face of the groove.

9. The optoelectronic device according to claim 1, wherein the groove is v-shaped, rounded, or square.

10. The optoelectronic device according to claim 1, wherein the substrate comprises a first series of grooves, a second series of grooves, and a channel between the first series of grooves and the second series of grooves, the groove of claim 1 being any one of the grooves of the first series of grooves or the second series of grooves.

11. The optoelectronic device according to claim 10, wherein the first series of grooves comprises a plurality of grooves, the second series of grooves comprises a plurality of grooves, wherein each of the plurality of grooves within the first series of grooves and the second series of grooves extends from a first end to a second end, and wherein the channel: transects each of the plurality of grooves of the first series of grooves towards the first end of each of the plurality of grooves, passes between the first series of groove and the second series of grooves, and transects each of the plurality of grooves of the second series of grooves towards the second end of each of the plurality of grooves.

12. The optoelectronic device according to claim 1, wherein the first semiconductor material is an n-type semiconductor material and the second semiconductor material is a p-type semiconductor material.

13. The optoelectronic device according to claim 1, wherein the first semiconductor material and the second semiconductor material are different materials so as to provide ohmic and rectifying contacts.

14. The optoelectronic device according to claim 10, wherein the channel has a depth, each of the plurality of grooves of the first series of grooves has a depth, each of the plurality of grooves of the second series of grooves has a depth, wherein the depth of each of the plurality of grooves within the first series of grooves is substantially the same as the depth of each of the plurality of grooves within the second series of grooves and the depth of the channel is at least twice the depth of each of the plurality of grooves of the first series of grooves.

15. The optoelectronic device according to claim 3, wherein the first semiconductor material on the first surface of the substrate adjacent the groove is further coated with an insulator material.

16. The optoelectronic device according to claim 1, wherein the optoelectronic device is a solar photovoltaic cell.

* * * * *